United States Patent

Nakajima et al.

[11] Patent Number: 5,982,348
[45] Date of Patent: Nov. 9, 1999

[54] ACTIVE MATRIX ELECTRO-OPTICAL DEVICE

[75] Inventors: Setsuo Nakajima, Kanagawa; Katunobu Awane, Nara; Tatsuo Morita, Kyoto, all of Japan

[73] Assignees: Semiconductor Energy Laboratory Co., Kanagawa-ken; Sharp Kabushiki Kaisha, Osaka, both of Japan

[21] Appl. No.: 08/921,839

[22] Filed: Sep. 2, 1997

[30] Foreign Application Priority Data

Sep. 3, 1996 [JP] Japan .................................. 8-252490

[51] Int. Cl.$^6$ ........................................................ G09G 3/36
[52] U.S. Cl. .................................. 345/92; 345/89
[58] Field of Search .................................. 345/92, 89, 82

[56] References Cited

U.S. PATENT DOCUMENTS 5,296,847  3/1994  Takeda et al. ........................... 345/92
5,526,012  6/1996  Shibahara ................................ 345/92

OTHER PUBLICATIONS

Nakanishi Hisao, A Study of CRT Stray Emisson Phenomenon with 2–D–FEM, Technical report of IEICE Japan.

*Primary Examiner*—Steven J. Saras
*Assistant Examiner*—Tewolde Mengisteab
*Attorney, Agent, or Firm*—Fish & Richardson P.C.

[57] ABSTRACT

In an active matrix display device integrated with a peripheral drive circuit using thin film transistors, when Vgr is a voltage required for one gradation, Ct is capacitance of all pixels, Cgd is capacitance between a gate and a drain, $\Delta Vg$ is a difference between ON/OFF gate voltages, and $\Delta Vs$ is a feedthrough voltage, the respective parameters satisfy an expression: $|vgr|>|(1/Ct)[Cgd \cdot \Delta Vg - Ct \cdot \Delta Vs]|$. According to this, even if dispersion occurs in the characteristics of the thin film transistors arranged for a buffer circuit or an active matrix circuit, it is possible to prevent the dispersion from influencing the gradation display.

2 Claims, 10 Drawing Sheets

CLOCKED INVERTER

INVERTER

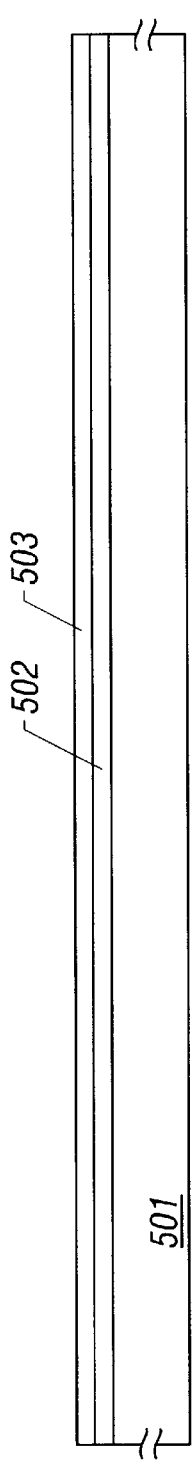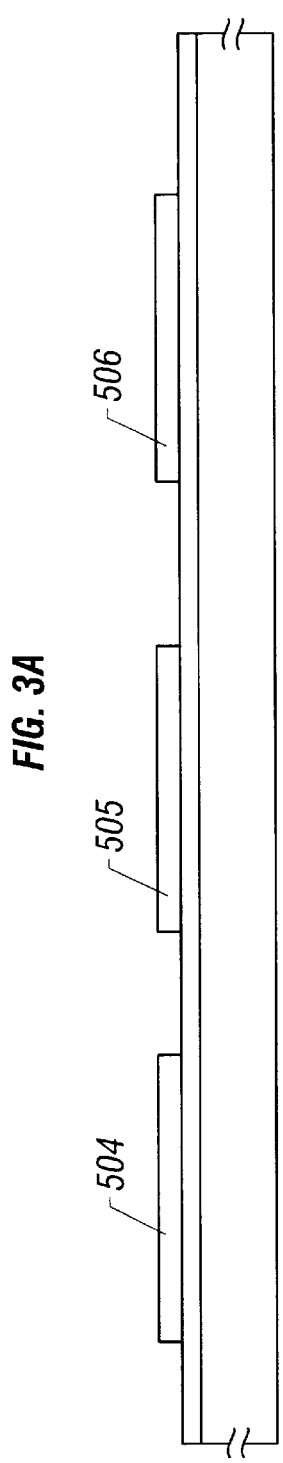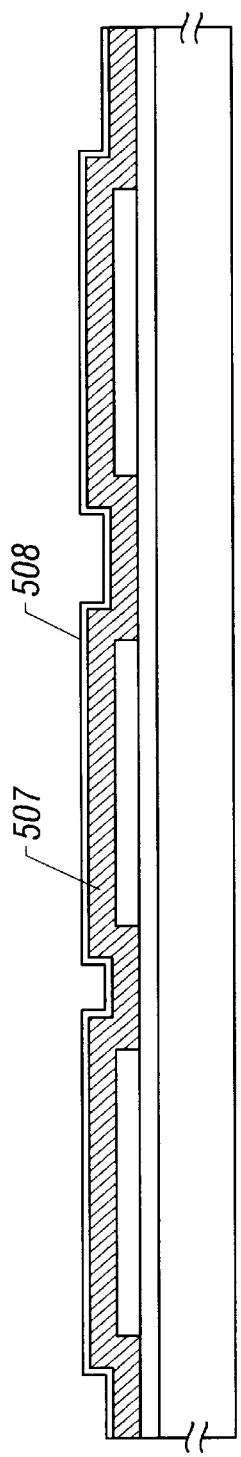
FIG. 3A
FIG. 3B
FIG. 3C

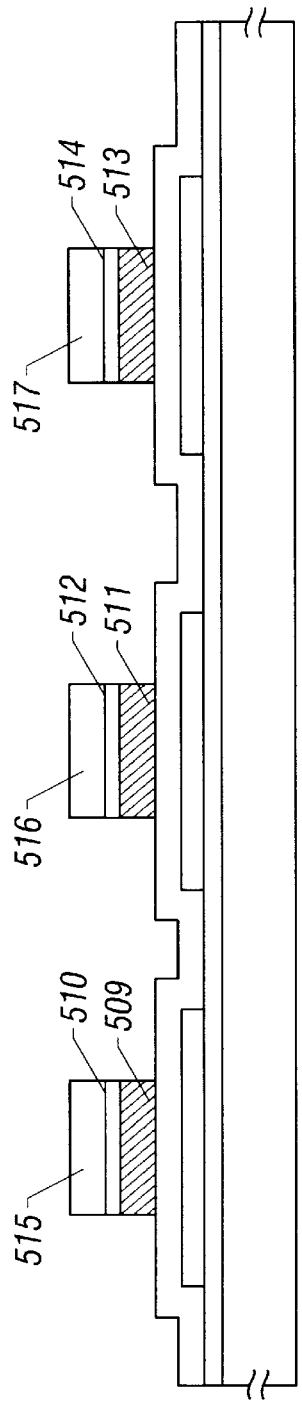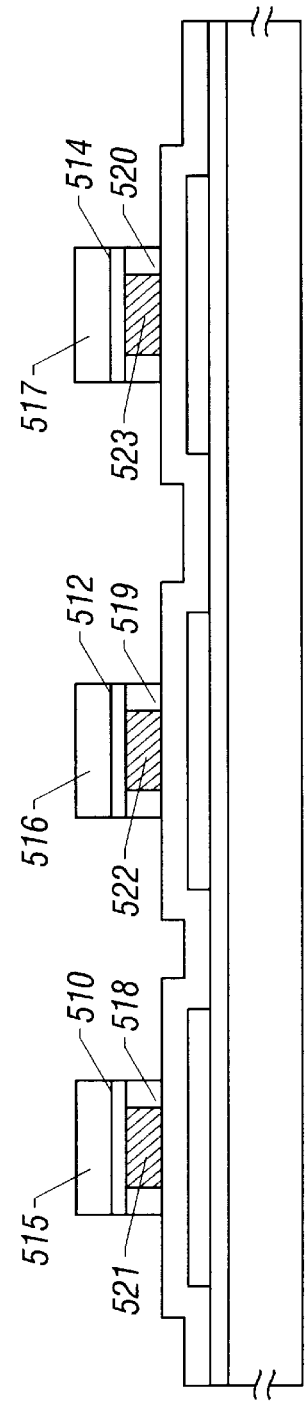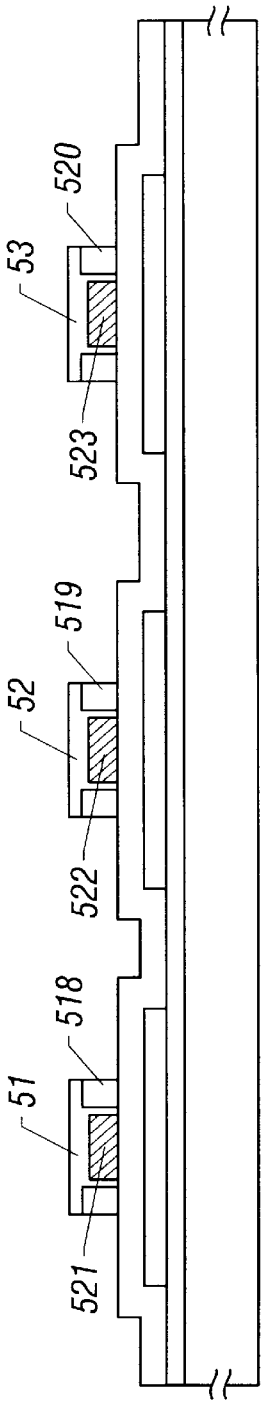

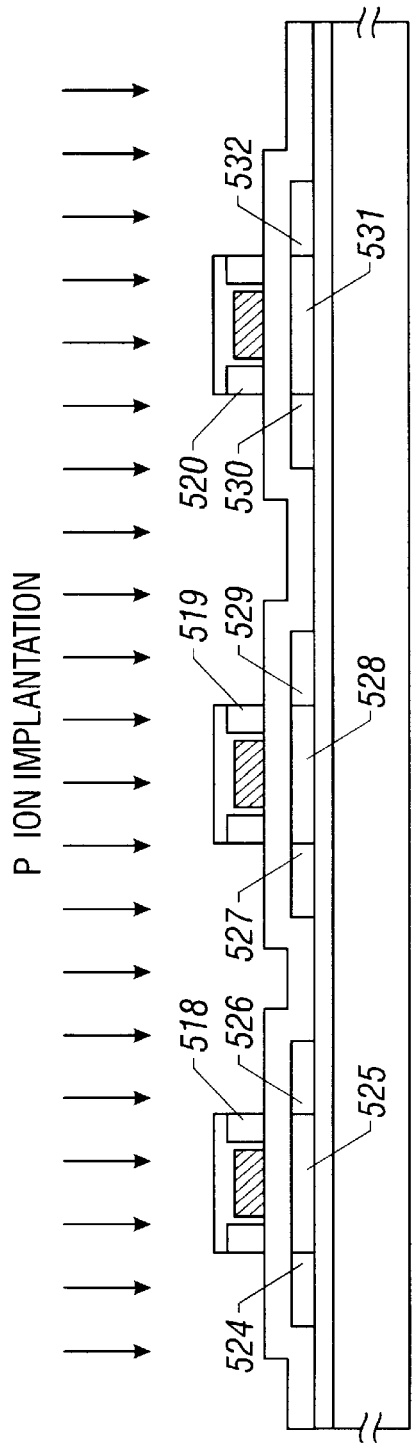
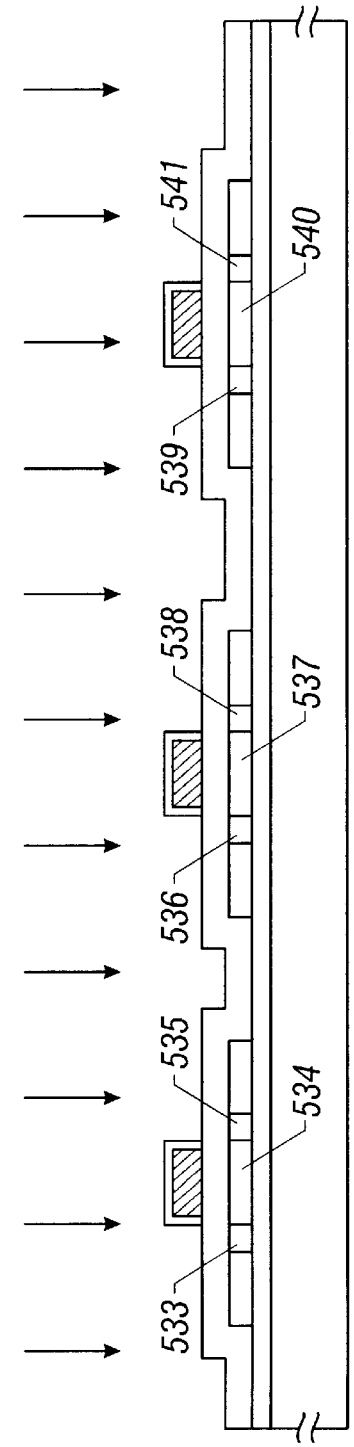

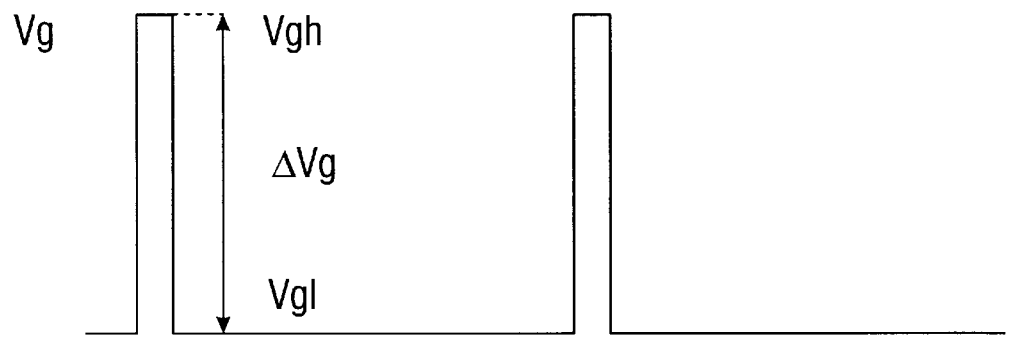
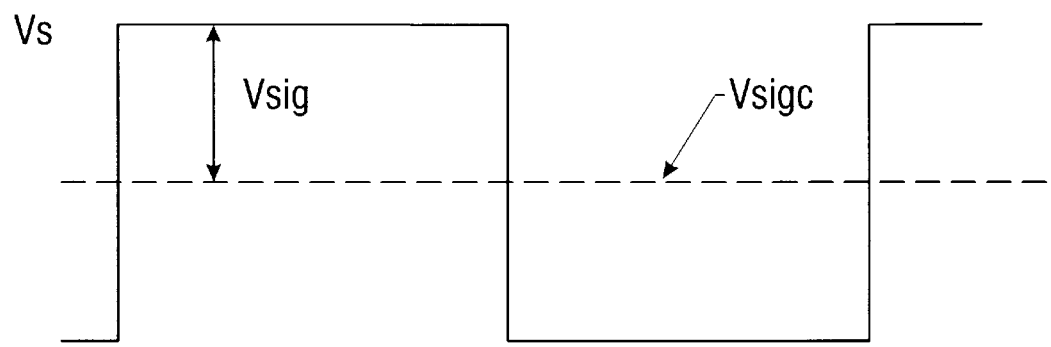
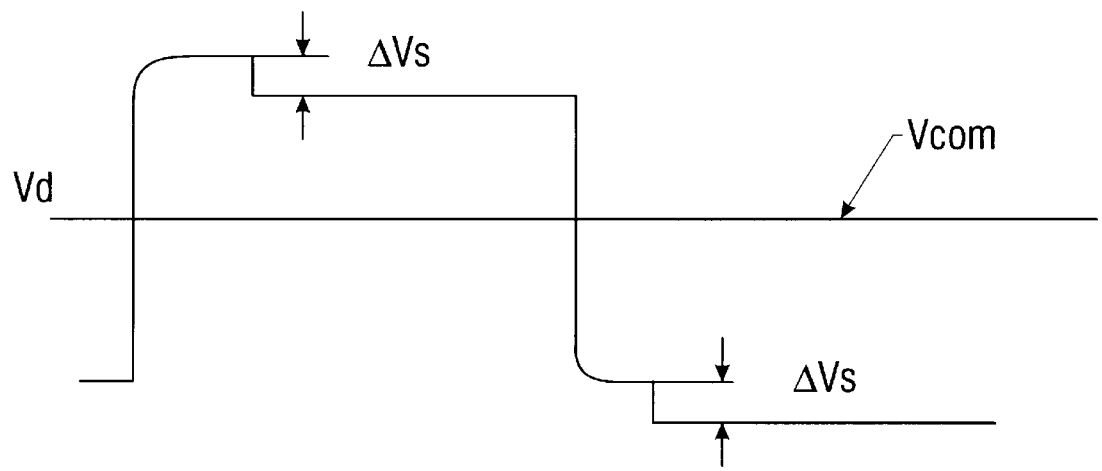
FIG. 11

5,982,348

ACTIVE MATRIX ELECTRO-OPTICAL DEVICE

BACKGROUND OF THE INVENTION

1. Field of the Invention

The present invention relates to a structure of an active matrix type flat panel display integrated with a peripheral drive circuit.

2. Description of the Related Art

An active matrix type liquid crystal display device using an amorphous silicon film has been conventionally known. Also, an active matrix type liquid crystal display device using a crystalline silicon film and being capable of performing higher quality display, has been known.

In the case where the amorphous silicon film is used, there is a problem that a P-channel type thin film transistor can not be realized (its characteristics are too low to be put into practical use). On the other hand, in the case where the crystalline silicon film is used, a practical P-channel type thin film transistor can be manufactured.

Accordingly, in case the crystalline silicon film is used, a CMOS circuit can be constituted by thin film transistors. If using this, a peripheral drive circuit for driving an active matrix circuit can also be constituted by thin film transistors. As shown in FIG. 10, it is possible to realize a structure where an active matrix circuit 10 and peripheral drive circuits 11 and 12 are integrated on a glass substrate or a quartz substrate. Such a structure is called a peripheral drive circuit integration type.

The structure of this peripheral drive circuit integration type has features that the entire of a display device can be made compact, and its manufacturing cost and manufacturing steps can be reduced.

When high picture quality is desired, it is important how fine gradation display can be performed. Generally, a non-saturated region of a voltage-transmissivity curve of a liquid crystal is used for performing the gradation display. That is, there is adopted a method of performing the gradation display by using the range in which optical response of a liquid crystal is changed in accordance with the change of an applied voltage (electric field). This method is generally called an analog gradation system.

In the case where this analog gradation system is used, the dispersion of voltage applied to the liquid crystal at respective pixels becomes a problem. Especially, when the dispersion of voltage applied to the liquid crystal becomes larger than a voltage required for one gradation, inconsistency occurs in the gradation display. The inconsistency of the gradation display causes display nonuniformity or a striped pattern to be seen.

The dispersion of voltage applied to the liquid crystal at the respective pixels is caused from the dispersion of characteristics of thin film transistors arranged in a matrix form in the unit of several hundred×several hundred. In the case of a peripheral drive circuit integration type, the dispersion of characteristics of thin film transistors of the peripheral drive circuit also becomes major cause.

There are generally many parameters relating to the dispersion of characteristics of the thin film transistors. Thus, even if any one parameter is controlled, it is difficult to solve the above problem that the picture quality is degraded. Further, this problem is made more serious since there is such a parameter the dispersion of which can not be completely suppressed.

As described above, since a parameter to be controlled with priority is not clear at present, there is a problem that it is difficult to mass-produce active matrix type display devices having required picture quality while keeping high reproductivity.

In other words, since it is not necessarily clear which parameter should be controlled in what range and in what relation with other parameters, under the present situation, an effort to improve a production yield is made by a short-sighted measure.

Accordingly, the present invention intends to provide guidelines as to which parameter for thin film transistors to be manufactured should be controlled with priority when an active matrix type display device integrated with a peripheral drive circuit is manufactured.

From this, the present invention intends to provide a technique to produce, with a high yield, an active matrix type display device integrated with a peripheral drive circuit which is capable of displaying with a high picture quality.

According to the knowledge of the present inventors, etc., the dispersion of feedthrough voltage at every pixel gives highest influence to the dispersion of liquid crystal driving voltage which highly relates to deterioration of picture quality of a liquid crystal display device.

The influence of a feedthrough voltage in an active matrix liquid crystal display is disclosed in Technical Bulletin EID95-99, ED95-173, SDM95-213 (1996-02), CORPORATION; ELECTRIC INFORMATION COMMUNICATION SOCIETY.

The feedthrough voltage will be described in brief below. FIG. 11 shows the relation of voltage waveforms of respective parts of a thin film transistor and a pixel electrode when the thin film transistor arranged in the active matrix circuit is operated.

In FIG. 11, Vg is a signal voltage supplied from a gate signal line. Vs is a signal voltage supplied from a drain wiring. Vd is an output voltage of the thin film transistor. Vd is a waveform of a voltage applied to a liquid crystal. First, when the gate voltage Vg rises to an ON level Vgh, the thin film transistor turns ON, and the voltage signal Vs supplied from the source signal line is applied to the liquid crystal through the thin film transistor. FIG. 11 shows the waveform of the voltage Vd applied to the liquid crystal.

After the gate voltage Vg falls to an OFF level Vgl, an electric field is kept applying to the liquid crystal by electric charge charged in the liquid crystal and auxiliary capacitance.

When a next pulse of the gate voltage Vg is inputted to the gate electrode, picture image information to the pixel electrode is rewritten. That is, when the next pulse of the gate voltage Vg is inputted to the gate electrode, the thin film transistor is again turned ON, so that electric charges corresponding to a new signal voltage Vs are flown into the pixel electrode.

Generally, in order to prevent deterioration of the liquid crystal, an alternating voltage expressed by Vsigc±Vsig is used as the voltage Vd. Here, Vsigc is a center voltage, and Vsig is an image signal voltage. The value of Vsig corresponds to a gradation.

In driving such a thin film transistor, when the thin film transistor is switched from an ON state to an OFF state, the trailing voltage (falling voltage) of the gate voltage Vg gives variation to a source voltage through parasitic capacitance between a gate and a source. This varying voltage is the feedthrough voltage ($\Delta Vs$). FIG. 11 shows the state in which the voltage Vd appearing at the pixel electrode is influenced by the feedthrough voltage ($\Delta Vs$). The feedthrough voltage ($\Delta Vs$) is expressed by the following expression (1).

$$\Delta Vs=(1/Ct)[Cgd \cdot \Delta Vg - \int Idt] \quad (1)$$

Here, Ct is capacitance of all pixels. The capacitance of all pixels is mainly determined by the addition of capacitance between pixel electrodes and opposite electrodes through a liquid crystal and auxiliary capacitance.

Cgd is parasitic capacitance between a gate and a drain. ΔVg is a variation amount of gate voltage. In the case shown in FIG. 11, ΔVg is expressed by ΔVg=Vgh−Vgl.

∫Idt is a term expressing the influence due to a compensation current flowing between a source and a drain, which is caused by the distortion of waveform of the signal voltage supplied from the gate signal line.

As shown in FIG. 10, the signal waveform transmitting through the gate wiring becomes a somewhat distorted form not a completely rectangular wave, as the signal transmits through the gate signal line. Especially, the falling portion of the signal becomes a waveform with a trail.

This is caused from the low characteristics of a gate driver circuit and further from a time constant determined by the product of wiring resistance and wiring capacitance.

FIG. 10 shows the state in which even if the peripheral drive circuit 11 exerts complete driving force to feed a completely rectangular wave 13, a transmitted signal waveform 14 is distorted by a time constant determined by the product of wiring resistance and wiring capacitance.

In the case where the peripheral drive circuit is constituted by the thin film transistors, it is difficult to send out a completely rectangular waveform in the existing circumstance. This is because it is difficult to obtain the thin film transistors having characteristics required for forming the peripheral drive circuit.

In the case where the thin film transistor is driven by the distorted waveform 14 as shown in FIG. 10, it takes a predetermined time until the thin film transistor turns completely OFF. In this period, a current flows in the direction to correct the feedthrough voltage. The term indicated by ∫Idt of expression (1) expresses the total amount of this current.

In the thin film transistor using an amorphous silicon film, since the mobility is small to be 1cm$^2$/Vs or less and an area of active layer is large (of course, also a channel area is large), the capacitance generated by charges flowing through a channel and electric charges stored in the channel makes a large contribution to the parasitic capacitance Cgd.

On the other hand, contribution of a value of I of the term indicated by ∫Idt is small since in the thin film transistor using the amorphous silicon film, the mobility is small to be 1cm$^2$/Vs or less.

Further, since a driver IC is used for the gate driver circuit, the distortion of the gate signal is not so large.

Accordingly, in the case where the thin film transistor using the amorphous silicon film is used, the contribution of the term indicated by ∫Idt is small.

Accordingly, in the case where the thin film transistor using the amorphous silicon film is used, the dispersion of the feedthrough voltage is mainly caused from the first term of expression (1). Especially, the dispersion of the parasitic capacitance Cgd becomes a main cause.

On the other hand, in a thin film transistor using a crystalline silicon film, the mobility is large, and the area of a gate electrode is small, so that the value of the parasitic capacitance Cgd is small as compared with the case of the thin film transistor using the amorphous silicon film. Also, since a channel area is small, the contribution of capacitance generated by electric charges flowing through the channel and electric charges stored in the channel is not so large.

The thin film transistor using the crystalline silicon film has a large mobility of several tens cm$^2$/Vs or more. However, the dispersion of the value is relatively large. In the peripheral circuit integration type, since the peripheral drive circuits 11 and 12 are constituted by thin film transistors, the distortion of gate signal voltage as shown by the waveform 14 in FIG. 10 also becomes large.

The fact that the distortion of the gate signal voltage is large means that the integration range of the second term in expression (1) becomes large. The distortion of the gate signal voltage reflects the influence of dispersion of mobility of thin film transistors constituting the peripheral drive circuit.

Thus, in the active matrix circuit integrated with a peripheral drive circuit constituted by thin film transistors using the crystalline silicon film, the dispersion of the feedthrough voltage expressed by expression (1) is influenced more strongly by the second term than the first term.

That is, by the dispersion of the mobility of the thin film transistors constituting the peripheral drive circuit, dispersion (which relates to distortion of the gate signal waveform 14 as shown in FIG. 10) occurs in the integration range of the second term of expression (1), and further by the dispersion of the mobility of the thin film transistors arranged at every pixel, dispersion occurs at the value of I of the second term of expression (1). These are combined to produce dispersion in the feedthrough voltage.

SUMMARY OF THE INVENTION

An object of the present invention is to provide a structure to suppress the deterioration of picture quality caused from the dispersion of the above-described feedthrough voltage in an active matrix type display device integrated with a peripheral drive circuit using thin film transistors composed of a crystalline silicon film.

The present invention has a feature that in order to suppress the deterioration of picture quality due to the dispersion of the above-described feedthrough voltage, the absolute value of a voltage Vgr required for one gradation is made larger than the absolute value of a second term of expression (1).

$$\Delta Vs=(1/Ct)[Cgd \cdot \Delta Vg - \int Idt] \quad (1)$$

That is, the present invention has a feature that the ranges of respective constants are determined to satisfy the following expression (2).

$$|Vgr| > |(1/Ct)\int Idt| \quad (2)$$

The above expression (2) provides guidelines as to combination of characteristics required for thin film transistors constituting respective circuits in the active matrix type display device integrated with a peripheral drive circuit.

Expression (2) is rewritten into the following expression (3) by using expression (1).

$$|Vgr| > |(1/Ct)[Cgd \cdot \Delta Vg - Ct \cdot \Delta Vs]| \quad (3)$$

Here, Vgr is a voltage required for one gradation. Ct is capacitance of all pixels including auxiliary capacitance. Cgd is gate-drain capacitance. ΔVg is a difference between ON/OFF gate voltages. ΔVs is a feedthrough voltage. In the present specification, an impurity region at a pixel electrode side is defined as a drain.

Vgr and ΔVg are determined by driving conditions or picture quality to be obtained. Ct and Cgd can be respectively calculated. ΔVs can be obtained by forming and measuring a sample or by performing a simulation.

The present invention is characterized by setting characteristics of thin film transistors constituting respective circuits so as to satisfy the above inequality. By performing such setting, even if dispersion occurs in the characteristics of the thin film transistors constituting the respective circuits, the influence due to the dispersion to the gradation display can be greatly suppressed.

Here, the value of respective parameters (mainly mobility) are defined as a mean value of a large number of thin film transistors arranged. As the mean value, an average of some thin film transistors subjected to sampling inspection may be used.

Accurately speaking, the dispersion of Ct and Cgd at respective pixels become a problem. However, as described before, in the thin film transistor using the crystalline silicon film, the contribution of dispersion of these parameters is small. Accordingly, by satisfying the range shown in expression (2), the deterioration of picture quality due to the dispersion of gradation display at respective pixels can be greatly suppressed.

According to an aspect of the present invention, the invention has a structure that thin film transistors are arranged at respective pixels arranged in a matrix form, and is characterized in that when Vgr is a voltage required for one gradation, Ct is capacitance of all pixels, Cgd is gate-drain capacitance, ΔVg is a difference between ON/OFF gate electrodes, and ΔVs is a feedthrough voltage, the respective parameters satisfy expression (3).

$$|Vgr| > |(1/Ct)[Cgd \cdot \Delta Vg - Ct \cdot \Delta Vs]| \quad (3)$$

According to another aspect of the present invention, the invention has a structure comprising an active matrix circuit in which thin film transistors are arranged at respective pixel electrodes arranged in a matrix form, and a peripheral drive circuit for driving the active matrix circuit constituted by thin film transistors, and is characterized in that when Vgr is a voltage required for one gradation, Ct is capacitance of all pixels, Cgd is gate-drain capacitance, ΔVg is a difference between ON/OFF gate electrodes, and ΔVs is a feedthrough voltage, respective parameters satisfy expression (3).

$$|Vgr| > |(1/Ct)[Cgd \cdot \Delta Vg - Ct \cdot \Delta Vs]| \quad (3)$$

and a mobility of a thin film transistor of a circuit for driving a gate signal voltage in the peripheral drive circuit is larger than a mobility of a thin film transistor arranged in the active matrix circuit.

BRIEF DESCRIPTION OF THE DRAWINGS

FIGS. 3A to 3C are views showing steps of simultaneously manufacturing an active matrix circuit and a peripheral drive circuit.

FIGS. 4A to 4C are views showing steps of simultaneously manufacturing the active matrix circuit and the peripheral drive circuit.

FIGS. 5A and 5B are views showing steps of simultaneously manufacturing the active matrix circuit and the peripheral drive circuit.

FIG. 11 is a view showing waveforms for driving a thin film transistor in an active matrix circuit.

DETAILED DESCRIPTION OF THE INVENTION

Figure 1:
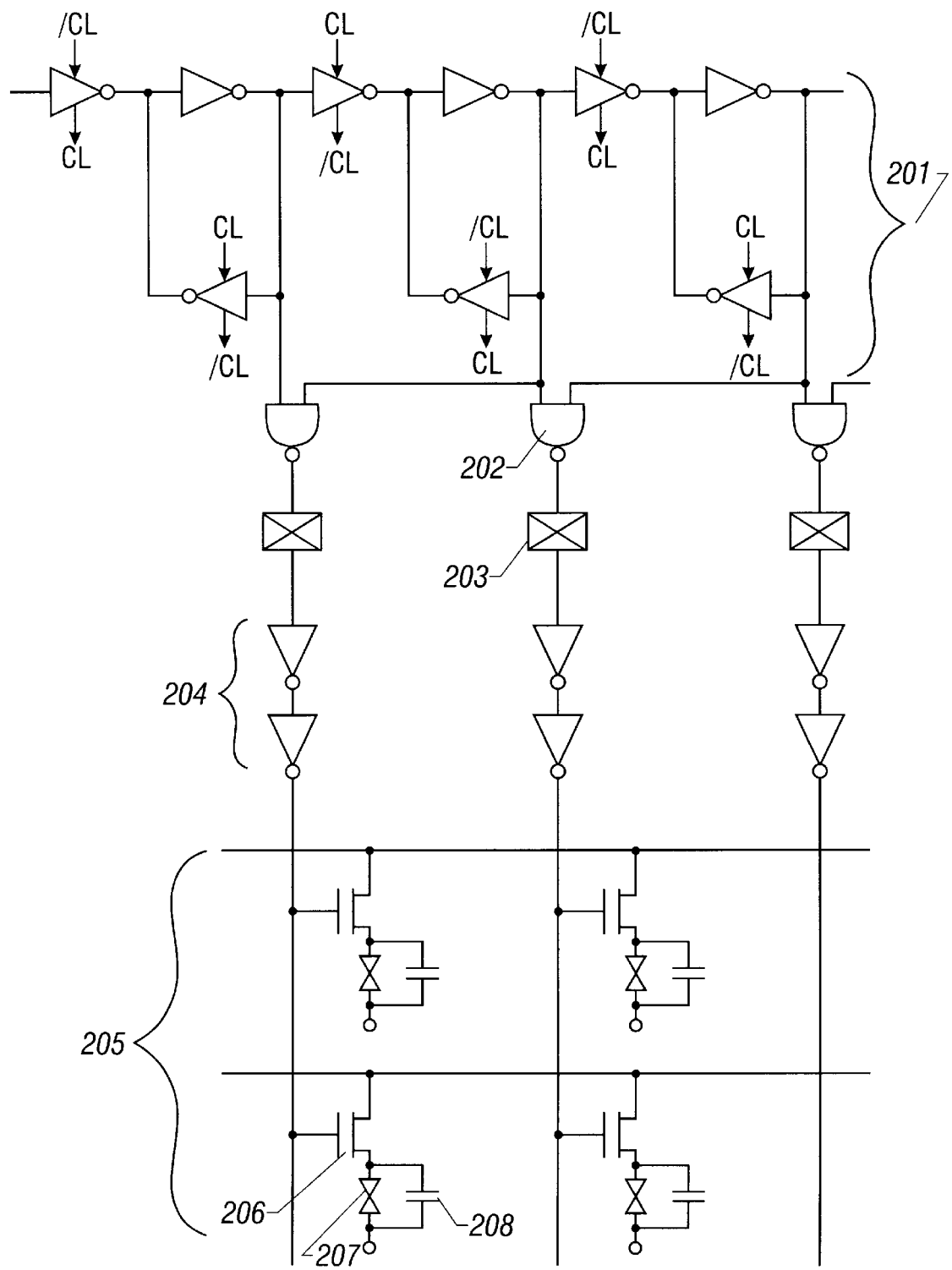
FIG. 1 is a view showing a structure in which an active matrix circuit and a peripheral drive circuit are integrated.

FIG. 1 shows a structure in which a peripheral drive circuit and an active matrix circuit are integrated on a piece of glass substrate. FIG. 1 shows the structure of one of two substrates of an active matrix type liquid crystal display device integrated with a peripheral drive circuit.

In FIG. 1, 201 designates a shift register circuit. 202 designates a NAND circuit. 203 designates a level shift circuit. 204 is a buffer circuit for driving (drive circuit). In the structure shown in FIG. 1, the peripheral drive circuit is constituted by these circuits.

205 designates an active matrix circuit. In FIG. 1, four pixels are shown. In a real active matrix circuit, pixels are arranged in a matrix form in a unit of several hundred× several hundred or more. The peripheral drive circuit comparable with those is arranged.

Thin film transistors 206 and auxiliary capacitances 208 are arranged for the respective pixels. 207 designates a liquid crystal.

Figure 2A:
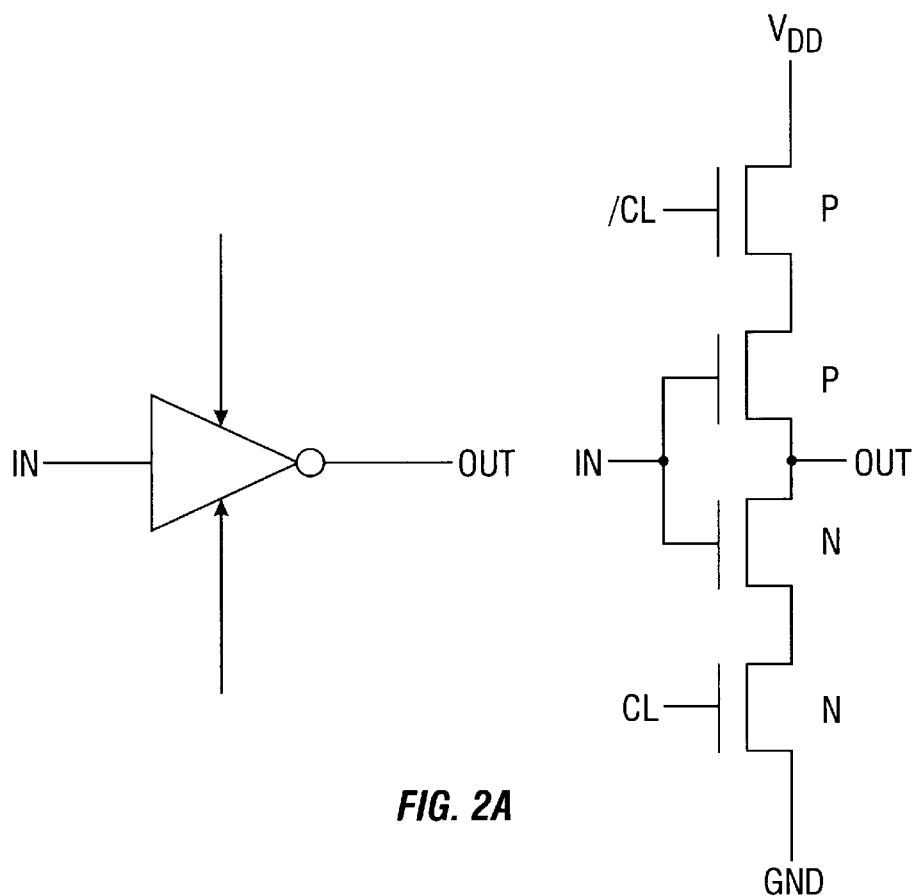
FIGS. 2A and 2B are views showing a structure of respective circuits.

In the structure shown in FIG. 1, all circuits are constituted by thin film transistors formed on the same glass substrate. For example, respective gates constituting the shift register circuit 201 are constituted by clocked inverter circuits as shown in FIG. 2A in which p-channel type and n-channel type thin film transistors are combined.

Figure 2B:
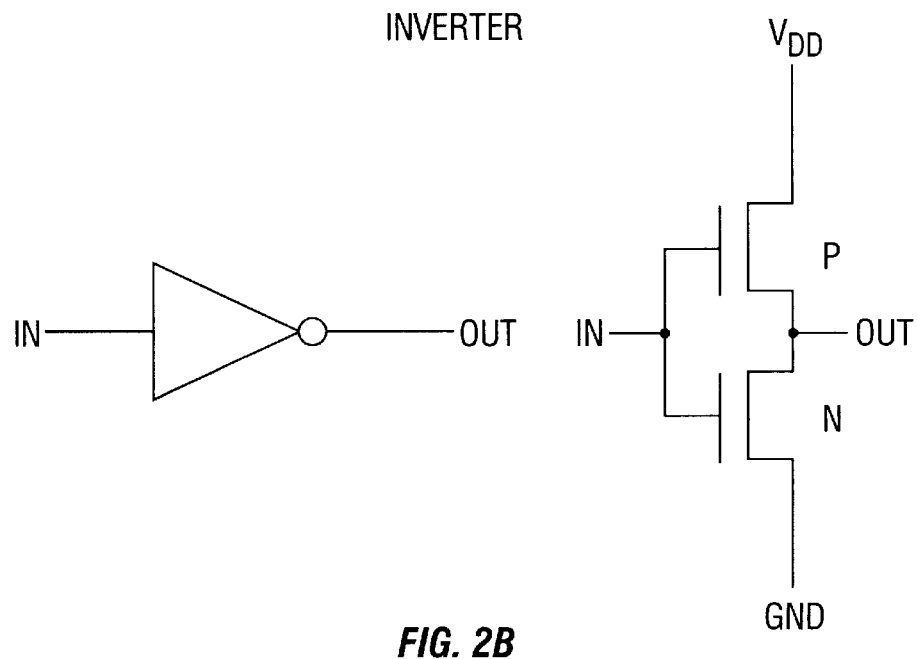

Respective gates for constituting the buffer circuit 204 are constituted by inverter circuits as shown in FIG. 2B in which p-channel type and n-channel type thin film transistors are combined.

Figure 10:
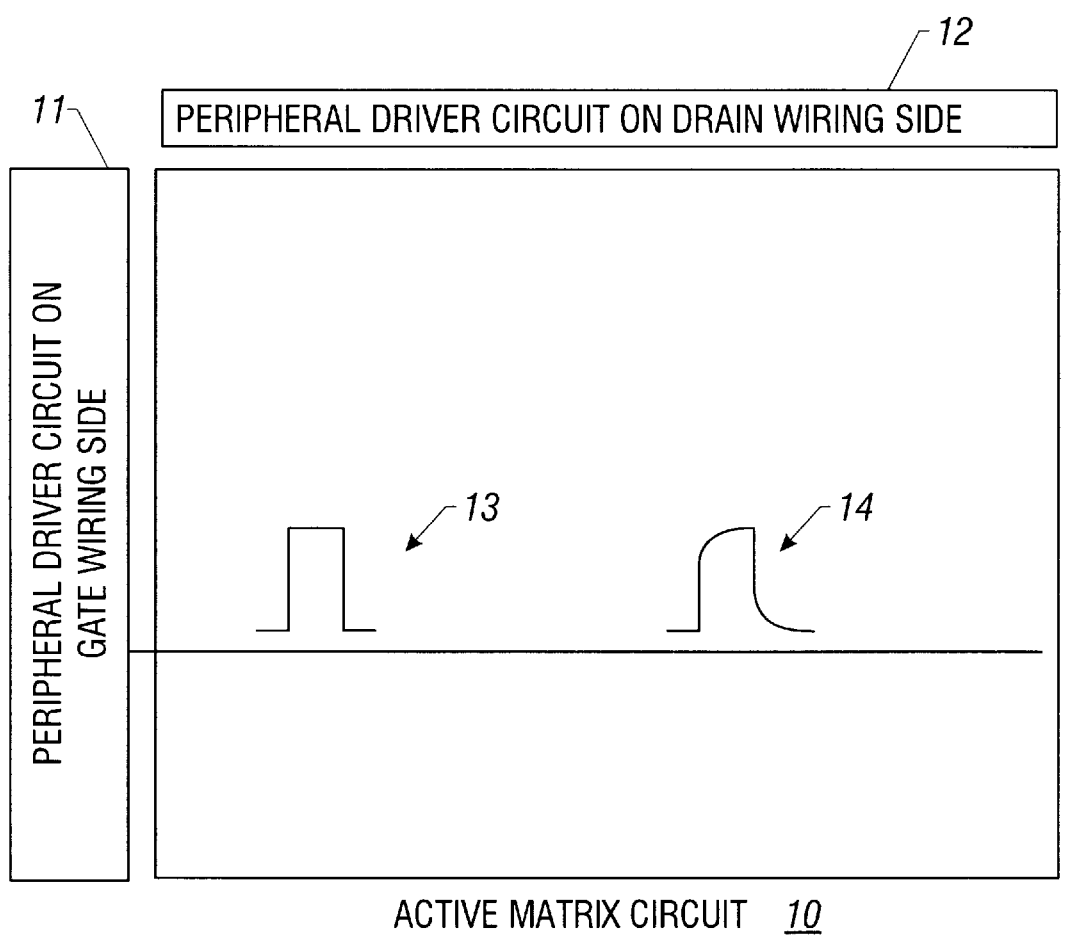
FIG. 10 is a view showing driving waveforms in an active matrix circuit.

A major cause of distortion of gate signal waveform as shown in FIG. 10 is that the characteristics (mainly relating to mobility) of the thin film transistors constituting the buffer circuit 204 are lower than required characteristics.

The dispersion of characteristics of the thin film transistors (mainly dispersion of mobility) arranged in the active matrix circuit 205 relates to the dispersion of value indicated by I in expression (1) and expression (2).

When the mobility of the thin film transistors constituting the buffer circuit 204 is made high, the distortion of gate signal waveform as shown in FIG. 10 can be made small. Of course, also the dispersion of distortion of gate signal waveform can be made relatively small.

However, it is technically difficult to increase the mobility of the thin film transistors integrated on the same substrate while maintaining uniformity in some degree. Thus, there are required guidelines to indicate the degree of uniformity and the largeness of the mobility. For example, there are required such guidelines for indicating the largeness of the mobility in relation to other parameters.

Also, for the similar reason, there are required guidelines to indicate the degree of dispersion of mobility of the thin film transistor 206 arranged in the active matrix circuit 205 (in other words, how much labor and cost are required).

The above guidelines are given by the following expression (2).

$$|V_{gr}| > |(1/C_t) \int I dt| \qquad (2)$$

That is, in the allowable range of cost and labor, manufacturing steps and conditions of the thin film transistors, and the dimension and type thereof are determined to satisfy the above expression (2). Then, an active matrix type liquid crystal display device having predetermined picture quality can be realized.

For example, as one method of satisfying expression (2), it can be conceived that the mobility of thin film transistors constituting the buffer circuit 204 is selectively increased so that the distortion of waveform as shown in FIG. 10 is made small. This case means that the integration range of dt in expression (2) is made small to satisfy expression (2).

In relation to this, the largeness of an active layer of the thin film transistors arranged in the active matrix circuit 205 is made small. Alternatively, the mobility thereof is made small. This means that the value of I of expression (2) is made small to satisfy expression (2).

By this, the right side of expression (2) is made small, so that expression (2) is satisfied. Of course, according to required gradation and liquid crystal material used, the value of the left side of expression (2) is different. Thus, in accordance with the value, it is necessary to set the combination of mobility of thin film transistors constituting the buffer circuit 204 and mobility of thin film transistors 206 constituting the active matrix circuit 205.

By this, it is possible to decrease the influence to gradation display by the dispersion of mobility of thin film transistors arranged at the peripheral drive circuit and the active matrix circuit 205.

Also, as is apparent from expression (2), increasing the value of the auxiliary capacitance 208 and the value of Ct is effective to decrease the value of the right side. In this case, it is sufficient that the combination of the mobility of the thin film transistors constituting the buffer circuit 204, the mobility of the thin film transistors 206 constituting the active matrix circuit 205, and the value of the auxiliary capacitance 208 is made to satisfy expression (2).

For example, in the case where the area of the active matrix region is made large, the distortion of gate signal waveform as shown in FIG. 10 is generated by the resistance and capacitance of the gate signal line. (This highly relates to the material forming the gate signal line, too.)

In this case, it is not very effective to increase the mobility of the thin film transistors constituting the buffer circuit to a certain degree or more. Also, when a material having a high resistance value is used for the gate signal line, the similar state occurs.

In this case, the size of the active layer of the thin film transistors 206 arranged in the active matrix region is made small in order to decrease the value of I. Specifically, the channel width is made narrow.

This means that the value of the above I is made small by decreasing the section of the channel. Also, in addition to decreasing the channel width, shortening the channel length is also effective. This is because by decreasing the channel area, the influence of dispersion of Cgd of expression (1) can be suppressed. Although it is estimated that the influence due to the dispersion of Cgd is not very large, it is basically preferable to decrease Cgd.

In order to decrease the value of I of expression (1), it is also effective to decrease the mobility of the thin film transistors 206 arranged in the active matrix circuit 205. Also, in order to satisfy expression (2), it is effective to increase Ct. In this case, the value of Ct can be made large by increasing the value of the auxiliary capacitance.

However, if the mobility of the thin film transistors 206 arranged in the active matrix circuit 205 is made too small, characteristics required for driving the liquid crystal can not be obtained, and therefore attention must be paid. (In general, the mobility of 10 cm$^2$/Vs or more is required.)

FIRST EMBODIMENT

FIG. 3 and the following drawings show basic steps for forming, on the same glass substrate, thin film transistor circuits of CMOS structure as basic circuits constituting the shift register circuit 201 and the buffer circuit 205 as shown in FIG. 1, and the thin film transistor 206 arranged at the respective pixels of the active matrix circuit. In the drawings, the left side shows manufacturing steps of the CMOS circuit. The right side shows manufacturing steps of an N-channel type thin film transistor arranged in the active matrix circuit.

Numerical values and conditions in the manufacturing steps described below are typical ones, and may be modified or optimized according to necessity. That is, the present invention is not limited to the recited values.

First, as shown in FIG. 3A, a silicon oxide film with a thickness of 3,000 Å as an under film 502 is formed on a glass substrate (or quartz substrate) 501. A sputtering method is used as a film growth method.

Next, an intrinsic or substantially intrinsic conductivity type amorphous silicon film 503 with a thickness of 1,000 Å is formed on the under film 502 by a plasma CVD method. A low pressure thermal CVD method may be used as a film growth method. In this way, the state shown in FIG. 3A is obtained. Next, the amorphous silicon film 503 is crystallized by performing heat treatment. As a method of crystallization, there are used laser light irradiation, lamp annealing, and combined method of the such methods and heat treatment.

Although described in another embodiment in detail, by selectively performing the laser light irradiation, it is possible to selectively control the mobility of the thin film transistors required for the respective circuits.

The crystalline silicon film of the present invention is a silicon film having crystal structure of higher order which can be obtained by performing heat treatment or laser light irradiation to an amorphous silicon film. Alternatively, the crystalline silicon film is a silicon film having crystal structure of higher order as compared with an amorphous silicon film. A silicon film generally referred to as a polycrystalline silicon film or fine crystalline silicon film is also included in the category of the crystalline silicon film according to the present invention.

After the amorphous silicon film 503 is crystallized, by performing patterning, island regions 504, 505 and 506 are formed (FIG. 3B).

In FIG. 3B, the region 504 becomes an active layer of a P-channel type thin film transistor constituting the CMOS circuit later. The region 505 becomes an active layer of an N-channel type thin film transistor constituting the CMOS later. The region 506 becomes an active layer of an N-channel type thin film transistor disposed in a pixel matrix circuit later. In this way, the state shown in FIG. 3B is obtained.

Figure 6:
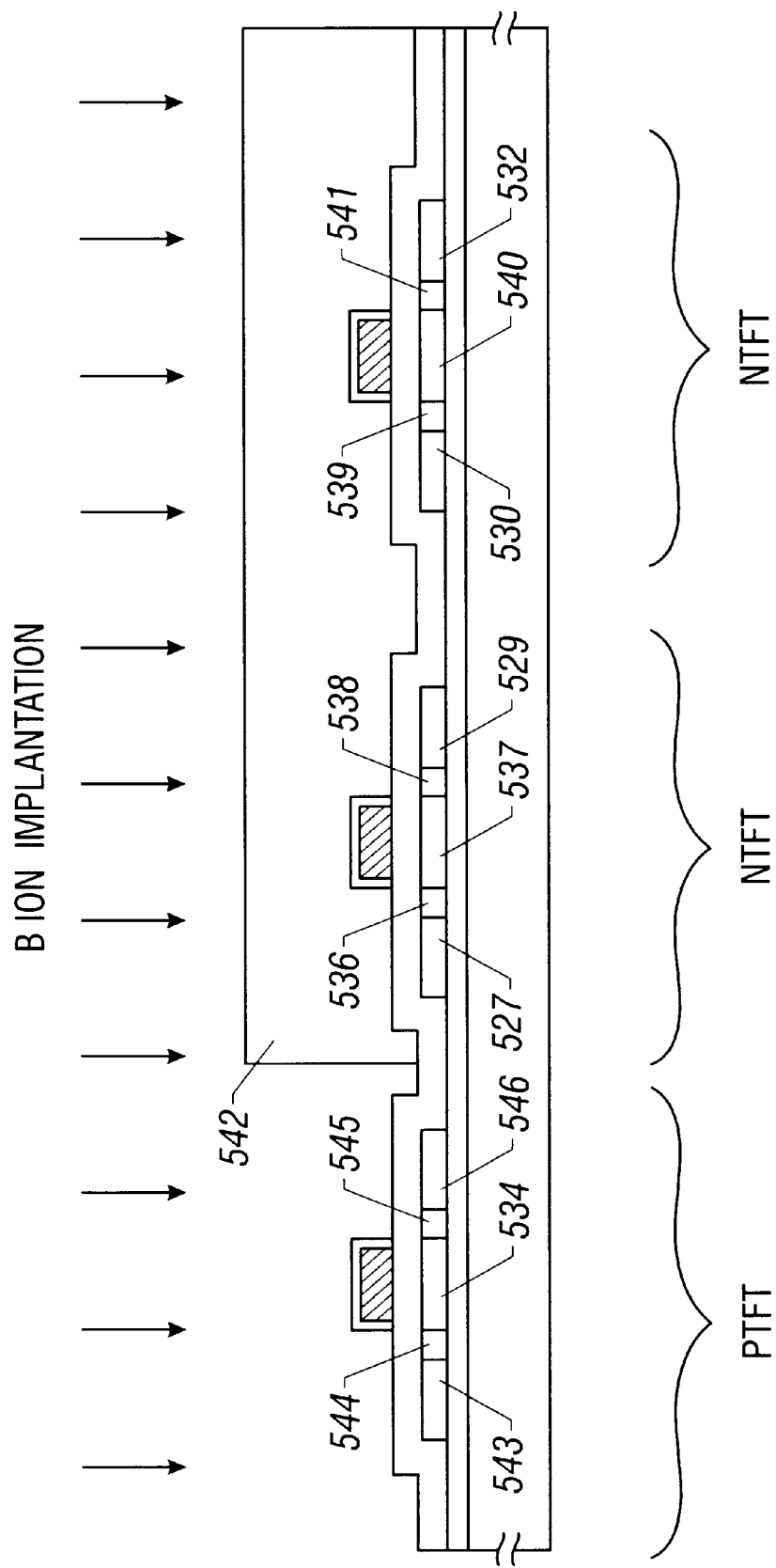
FIG. 6 is a view showing steps of simultaneously manufacturing the active matrix circuit and the peripheral drive circuit.

In the drawing, although the respective active layers are shown at the same size for reasons of drawing the figures, the mobility of the thin film transistors can be substantially controlled by changing a channel width or channel length. In general, in accordance with required characteristics, the dimension and shape of the thin film transistors are determined. That is, the width (channel width) of the active layer 506 of the thin film transistor (see FIG. 6) arranged in the active matrix circuit shown at the right side of the drawing, is made as narrow as possible to decrease the value of I of expression (2). Further, in order to decrease Cgd, the channel length is made as narrow as possible.

Also, the active layers 504 and 505 constituting the CMOS circuit that constitutes the buffer circuit (expressed by 204 of FIG. 1) are set so that the channel width becomes as large as possible. By this, it is possible to improve the ON-state current characteristics of the thin film transistors constituting the buffer circuit and to suppress the distortion of waveform of the gate signal voltage.

Next, an aluminum film 507 with a thickness of 5,000 Å for constituting the gate electrode is formed by a sputtering method. Scandium or yttrium of 0.1 to 0.2 weight % is made to be included in the aluminum film 507. This is made to suppress the formation of hillocks or whiskers in later steps (FIG. 3C).

The hillocks or whiskers are needle-like or spine-like protrusions due to abnormal growth of aluminum caused by heating.

After the aluminum film 507 is grown, an anodic oxidation film 508 having dense film quality is formed. The formation of the anodic oxidation film 508 having the dense film quality is carried out in an ethylene glycol solution containing tartaric acid of 3% as an electrolytic solution.

That is, in this electrolytic solution, an anodic oxidation current is flown with the aluminum film 507 as an anode and platinum as a cathode so that the anodic oxidation film 508 is formed. The film thickness of the anodic oxidation film 508 is made about 100 Å. The film thickness of the anodic oxidation film 508 is adjusted by controlling an applied voltage.

The anodic oxidation film 508 functions to improve the adhesion of a resist mask arranged in a subsequent step.

In this way, the state shown in FIG. 3C is obtained. Next, as shown in FIG. 4A, resist masks 515, 516 and 517 are arranged. Then, the aluminum film 507 (see FIG. 3C) is patterned. At this time, if the film thickness of the anodic oxidation film 508 (see FIG. 3C) is thick, patterning of the aluminum film 507 becomes difficult, and therefore attention must be paid.

In FIG. 4A, 509, 511 and 513 designate aluminum patterns as originals (base) of the gate electrodes. 510, 512 and 514 designate anodic oxidation films having dense film quality remaining on the aluminum patterns.

After the state shown in FIG. 4A is obtained, anodic oxidation is again performed. Here, porous anodic oxidation films 518, 519 and 520 are formed (FIG. 4B).

In this step, a solution containing oxalic acid of 3% is used. In this electrolytic solution, anodic oxidation is carried out with the aluminum patterns 509, 511 and 513 as an anode and platinum as a cathode.

In this step, since the resist masks 515, 516 and 517 and the dense anodic oxidation films 510, 512 and 514 exist, anodic oxidation proceeds at the sides of the aluminum patterns 509, 511 and 513.

In this way, porous anodic oxidation films are formed at portions denoted by reference numerals 518, 519 and 520. The film thickness of the porous anodic oxidation film is controlled by an anodic oxidation time.

Here, the porous anodic oxidation films 518, 519 and 520 are formed to have a thickness of 5,000 Å. The porous anodic oxidation films are used when low concentration impurity regions (LDD regions) are formed later.

After the state shown in FIG. 4B is obtained, the resist masks 515, 516 and 517 are removed by an exclusive peeling liquid. Then, anodic oxidation is again carried out in the condition of forming an anodic oxidation film having dense film quality.

As a result, anodic oxidation films 51, 52 and 53 having dense film quality are formed. Here, the anodic oxidation films 51, 52 and 53 are formed in the state where they are integral with the previously formed anodic oxidation films 510, 512 and 514 (FIG. 4C).

In this step, since the electrolytic solution intrudes into the inside of the porous anodic oxidation films 518, 519 and 520, the anodic oxidation films 51, 52 and 53 having dense film quality are formed in the state as shown by reference numerals 51, 52 and 53 in FIG. 4C.

The film thickness of the anodic oxidation films 51, 52 and 53 having the dense film quality is 1,000 Å. The anodic oxidation films 51, 52 and 53 have a function to electrically and mechanically protect the surface of the gate electrode (and gate wiring extending therefrom). Specifically, the films have the function to improve electrical insulation and to suppress formation of hillocks and whiskers.

In the step shown in FIG. 4C, a gate electrode 521 of the P-channel type thin film transistor and gate electrodes 522 and 523 of the N-channel type thin film transistor are defined. After the state shown in FIG. 4C is obtained, P (phosphorus) ions are implanted. In this step, P ions are implanted with a dose amount for forming source and drain regions. P ion implantation is carried out by a well known plasma doping method (FIG. 5A).

In this step, P ions with a relatively high concentration are implanted into regions 524, 526, 527, 529, 530 and 532. The dose amount in this step is $1 \times 10^{15}/\text{cm}^2$. An ion acceleration voltage is 80 kV.

In the P ion implantation step shown in FIG. 5A, P ions are not implanted into regions 525, 528 and 531. Thus, the intrinsic or substantially intrinsic state is maintained.

After the P ion implantation shown in FIG. 5A is ended, the porous anodic oxidation films 518, 519 and 520 are selectively removed by using a mixed acid of phosphoric acid, acetic acid, and nitric acid.

Then, as shown in FIG. 5B, P ion implantation is again conducted. In this step, P ion implantation is carried out with a dose amount lower than a dose amount in the step of FIG. 5A. Here, the dose amount is 0.5 to $1 \times 10^{14}/\text{cm}^2$. An acceleration voltage of ions is 70 kV.

As a result of this step, respective regions 533, 535, 536, 538, 539 and 541 become N-type (weak N-type) regions. These regions become low concentration impurity regions added with P ions of a concentration lower than the respective regions 524, 526, 527, 529, 530 and 532 (FIG. 5B).

The respective regions 534, 537 and 540 immediately under the gate electrodes 521, 522 and 523 are defined as channel forming regions.

Strictly speaking, offset gate regions are formed at both sides of the channel forming regions 534, 537 and 540 with the film thickness of the anodic oxidation films 51, 52 and 53 having dense film quality and formed in the step of FIG. 4C. However, in this embodiment, since the film thickness of the anodic oxidation films 51, 52 and 53 is about 1,000 Å, the offset gate regions are not shown in the drawing.

After impurity ion implantation shown in FIG. 5B is ended, as shown in FIG. 6A, a resist mask 542 is arranged, and B (boron) ions are implanted at this time.

By the implantation of B ions, the conductivity of the respective regions 543, 544, 545 and 546 is inverted from N type to P type. Here, the dose amount of B ions is $2 \times 10^{15}/\text{cm}^2$. The acceleration voltage is 60 kV.

After B ion implantation shown in FIG. 6A is ended, the resist mask 542 is removed. KrF excimer laser irradiation is performed to the entire to anneal the regions where impurity ions are injected and to activate the injected impurity ions.

In this way, the P-channel type and N-channel type thin film transistors constituting the CMOS circuit, and the N-channel type thin film transistor arranged in the active matrix region are simultaneously formed.

Figures 7A, 7B:
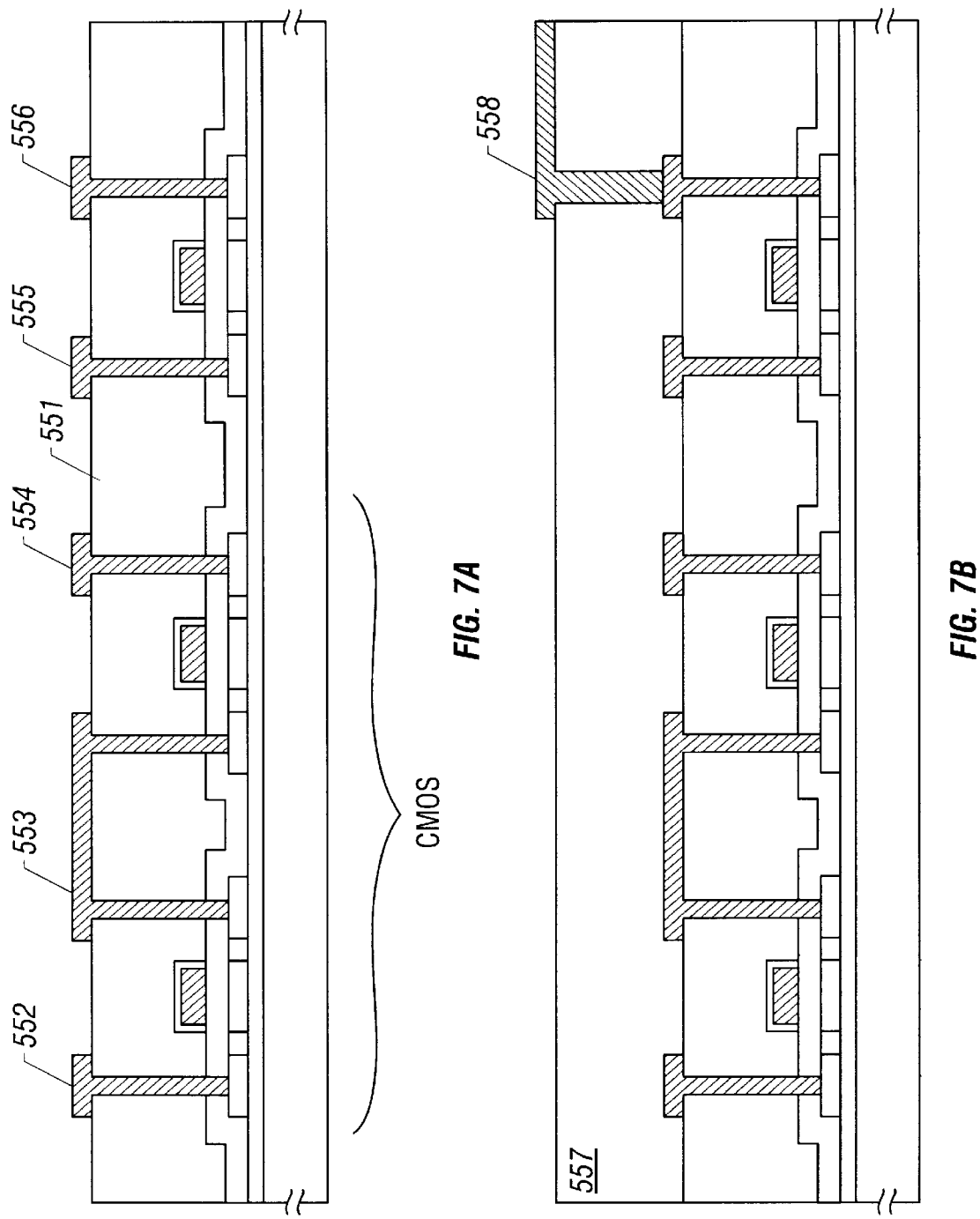
FIGS. 7A and 7B are views showing steps of simultaneously manufacturing the active matrix circuit and the peripheral drive circuit.

As shown in FIG. 7A, an interlayer insulating film 551 is formed. The interlayer insulating film 551 is made of a silicon oxide film. Other than the silicon oxide film, a laminated film of a silicon nitride film and a silicon oxide film, or a laminated film of a silicon oxide film or a silicon nitride film and a resin film may be used.

After the interlayer insulating film 551 is formed, a contact hole is formed. A source electrode 552 and a drain electrode 553 of the P-channel type thin film transistor, and a drain electrode 553 and a source electrode 554 of the N-channel type thin film transistor are formed.

In this way, the CMOS circuit complementarily composed of the P-channel type thin film transistor and the N-channel type thin film transistor is completed.

Further, at the same time, a source electrode 555 (generally provided by extending from a picture image signal line (source signal line) arranged in a matrix form), and a drain electrode 556 are formed, so that the N-channel type thin film transistor arranged in the active matrix circuit is completed.

After the state shown in FIG. 7A is obtained, a second interlayer insulating film 557 is formed. Then, a contact hole is formed, and a pixel electrode 558 made of ITO is formed. Then, heat treatment in a hydrogen atmosphere at 350° C. for one hour is carried out to compensate defects in the active layer. In this way, the active matrix circuit (pixel matrix circuit) and peripheral drive circuit can be simultaneously formed.

After the state shown in FIG. 7B is obtained, a rubbing film not shown is formed, and a well known rubbing treatment is carried out. The substrate shown in FIG. 7B is bonded to an opposite substrate prepared separately, and a liquid crystal is injected into the space therebetween. In this way, the active matrix type liquid crystal display device integrated with a peripheral drive circuit is completed.

SECOND EMBODIMENT

This embodiment shows manufacturing steps for an active matrix type liquid crystal display device for individual usage on the basis of the manufacturing steps shown in the first embodiment.

An objective device in this embodiment is a small liquid crystal display device having a largeness of 5 inches or less in a diagonal line. Of course, it is assumed that this liquid crystal display device has a structure in which a peripheral drive circuit is integrated. Also, it is assumed that aluminum having a low resistance is used as gate wiring.

Also in the structure shown in this embodiment, the basic structure is the same as that shown in FIG. 1. The manufacturing steps of the thin film transistors are also the same as those shown in FIG. 3 and the following drawings. When the structure shown in this embodiment is made, the distortion of the waveform 14 due to the influence of gate wiring resistance and capacitance as shown in FIG. 10 does not become a very serious problem.

Accordingly, in order to satisfy the inequality shown in expression (2), it is effective to make the mobility of the thin film transistors constituting the buffer circuit (indicated by 204 in FIG. 1) as large as possible.

In this embodiment, in order to increase the mobility of the thin film transistors constituting the buffer circuit, in the step shown in FIG. 3A, annealing by laser light irradiation is carried out to the peripheral drive circuit, especially only to regions where the buffer circuit is arranged.

By this, the crystallinity of the crystalline film constituting the thin film transistors of the buffer circuit is selectively improved.

As a laser, it is effective to use a KrF excimer laser (wavelength 248 nm) or a XeCl excimer laser (wavelength 308 nm). Further, a linearly shaped beam is used as a laser light, and the thin film transistors constituting the buffer circuit are also made to have a pattern arranged linearly. It is designed so that one pulse irradiation can simultaneously anneal the regions of the thin film transistors arranged linearly. Especially, in this embodiment, since the substrate is small, the linear laser light is concentrated to increase the uniformity.

By this, it is possible to increase the mobility of the thin film transistors constituting the buffer circuit and to decrease the dispersion of the characteristics.

In this way, an integration range of dt of expression (2) is made narrow and the dispersion of dt itself is made small.

On the other hand, in the thin film transistors arranged in the active matrix region, a crystalline silicon film formed by a heat treatment is used, and though the mobility is small, the dispersion is made small. Further, the channel area is made as small as possible, the influence of the dispersion of Cgd of expression (2) is made small, and the value of I is made small. Specifically, by using an amorphous silicon film formed in the film forming condition where attention is paid to uniformity of the film quality, and further by performing heat treatment while paying attention to uniformity of heating, an effort is made to suppress the dispersion of crystallinity in the active matrix region as small as possible.

In this way, the structure satisfies the above expression (2). Of course, this structure satisfies expression (3), too.

THIRD EMBODIMENT

This embodiment shows another method of manufacturing an active matrix type liquid crystal display device as shown in the second embodiment.

In the case where the active matrix structure integrated with a peripheral drive circuit is realized by the method shown in the second embodiment, a laser irradiation apparatus capable of performing stable oscillation is required.

At present, an excimer laser apparatus is in an experimental level and is expensive. Further, it has a problem in stability and the like. Still further, it does not reach a satisfactory level in maintenance. Moreover, there is a problem that it takes labor to find conditions of most suitable irradiation.

Thus, the structure of this embodiment has a feature that the value of Ct is made large, so that the inequality of expression (2) is satisfied.

Figure 8:
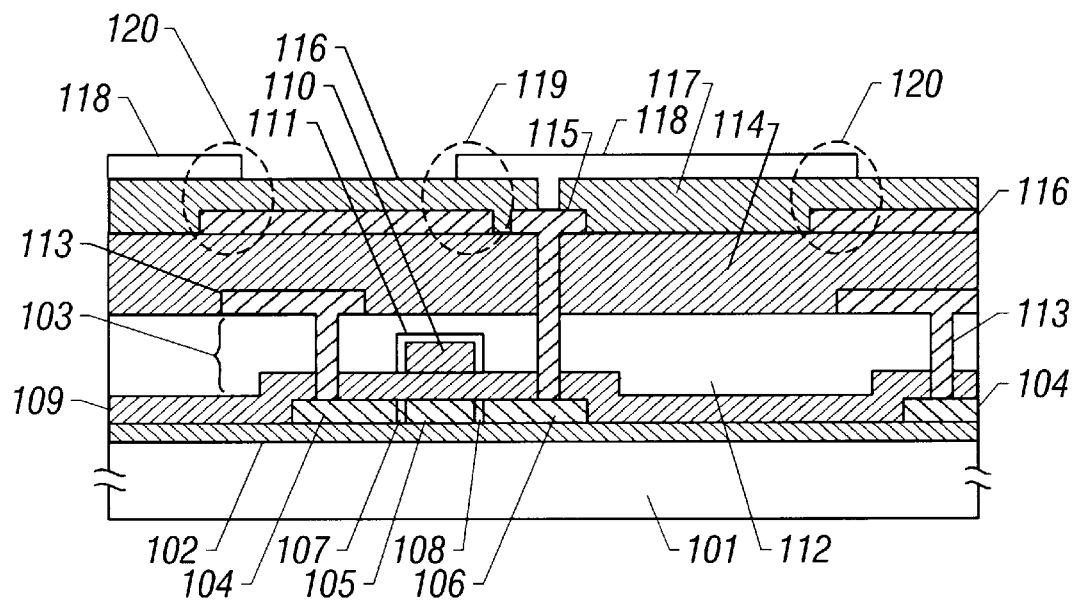
FIG. 8 is a sectional view showing one pixel portion of an active matrix circuit.
Figure 9:
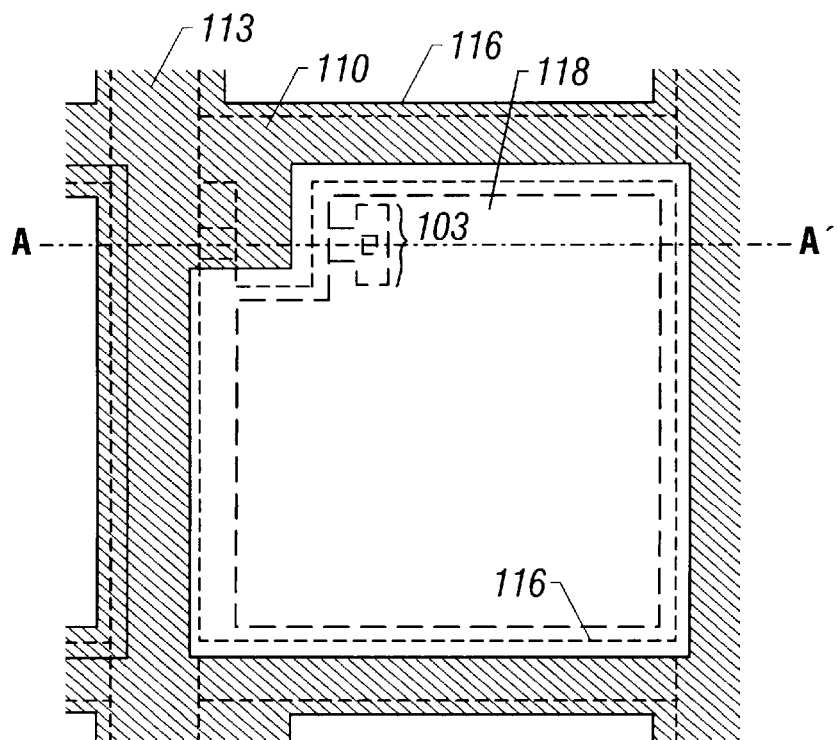
FIG. 9 is a top view showing the one pixel portion of the active matrix circuit.

In this case, in order to increase the value of auxiliary capacitance, it is necessary to design the arrangement process of the auxiliary capacitance. Then, in this embodiment, the active matrix region is made a structure as shown in FIGS. 8 and 9. FIG. 8 shows a section taken along line A–A' of FIG. 9.

The structure shown in FIGS. 8 and 9 is a part of a substrate at the side where the active matrix circuit is disposed. FIGS. 8 and 9 show a portion corresponding to one pixel.

In FIGS. 8 and 9, a thin film transistor is formed at a portion 103. 101 designates a glass substrate. 102 designates a silicon oxide film forming an under film. An active layer of the thin film transistor is composed of regions 104, 107, 105, 108 and 106. This active layer is formed of a crystalline silicon film crystallized by applying heating to an amorphous silicon film.

In the active layer, 104 designates a source region, 107 and 108 designate offset gate regions, 105 designates a channel formation region, and 106 designates a drain region.

109 designates a silicon oxide film functioning as a gate insulating film. 110 designates a gate electrode containing aluminum as main component. The gate electrode 110 extends from gate wiring arranged in a matrix form.

111 designates an anodic oxidation film formed by performing anodic oxidation with aluminum as an anode. The offset gate regions 107 and 108 are formed by the thickness of the anodic oxidation film 111.

In order to form the effectively functioning offset gate regions 107 and 108, it is necessary to make the anodic oxidation film 111 have a film thickness of more than about 2,000 Å.

112 designates a first interlayer insulating film made of a silicon oxide film. 113 designates a lead electrode from the source region 104. 115 designates a lead electrode made of titanium from the drain region 106, and is connected to the ITO electrode 118 which becomes a pixel electrode. 114 designates a second interlayer insulating film, and 117 designates a third interlayer insulating film.

116 designates a titanium electrode used also as a black matrix. Other than titanium, chromium or the like is used. This titanium electrode 116 is disposed to overlap with the periphery of the pixel electrode 118 so as to function as a black matrix (BM). The titanium electrode 116 is formed at the same time as the lead electrode 115.

The region where the titanium electrode 116 and the pixel electrode 118 overlap with each other, becomes an auxiliary capacitance. That is, at the portions 119 and 120, the pixel electrode 118 and the titanium electrode 116 forms the capacitance through the third interlayer insulating film 117. Since the insulating film 117 is made thin, the capacitance can be made large.

Here, the insulating film 117 is made of a silicon nitride film, and the film thickness is made 300 Å. The silicon nitride film has a large relative dielectric constant of about 6. Thus, the capacitance expressed by Ct of expression (2) can be made large. In general, the relative dielectric constant of the silicon oxide film often used as an insulating film is about 4.

The silicon nitride film can be made to have dense film quality. Accordingly, even if the thickness is made thin, it is possible to avoid a problem of short circuit between electrodes due to existence of pinholes.

The titanium electrode 116 is disposed to cover most portions of the thin film transistor 103. This arrangement is made to prevent the operation from being influenced by irradiation to the thin film transistor.

The degree of overlap between the electrode 116 used also as the BM and the pixel electrode 118 is determined to satisfy the value of Ct obtained from the inequality expressed by expression (2). In this case, it is sufficient to first determine the characteristics of the thin film transistor, and then to calculate the value of Ct in accordance with expression (2).

FOURTH EMBODIMENT

This embodiment relates to a technique for producing an active matrix circuit and a peripheral drive circuit with thin film transistors having different crystallinity in order to satisfy the inequality expressed by expression (2).

Expression (2) indicates that when the mobility of the thin film transistors arranged in the active matrix circuit is made small, while the mobility of the peripheral drive circuit, especially of the buffer circuit is made large, the dispersion of voltage applied to the liquid crystal can be effectively decreased.

In order to realize the above structure, a silicon film having a relatively low crystallinity is formed for the active matrix circuit region, and a silicon film having a relatively high crystallinity is formed for the peripheral drive circuit region.

In this embodiment, the crystalline silicon film formed in the peripheral drive circuit region (or buffer circuit region) is formed by using metal elements for promoting crystallization of silicon, while the crystalline silicon film formed in the active matrix circuit region is formed without using the above metal elements.

Specifically, in the state shown in FIG. 3A, regions other than those where the thin film transistors constituting the peripheral drive circuit are formed, are masked with silicon oxide films or the like, and a solution containing metal elements for promoting crystallization of silicon is applied in that state.

By performing heat treatment, the amorphous silicon film 503 is crystallized. For example, the heat treatment is carried out at 640° C. and for 24 hours. Then, the region where the metal elements were introduced has relatively high crystallinity, and the region where the metal elements were not introduced has relatively low crystallinity.

That is, in the active matrix region, the thin film transistor can be formed of the crystalline silicon film having relatively low crystallinity, and in the peripheral drive circuit region, the thin film transistor can be formed of the crystalline silicon film having relatively high crystallinity.

By this, the mobility of the thin film transistors constituting the peripheral drive circuit is made high, while the mobility of the thin film transistors constituting the active matrix region is made small.

Ni (nickel) is used as a metal element for promoting crystallization of silicon. A solution of nickel salt acetate can be used as a solution containing Ni. The amount of introduced Ni can be controlled by adjusting the nickel concentration in the solution.

The method of using the solution is effective for control of an introducing amount of the metal element and for assurance of the uniformity of the introducing amount.

By using the invention disclosed in the present specification, priority of portions where a technique is concentrically applied can be determined. Since the portion where a technique is concentrically applied is made clear, an active matrix type display device with superior picture quality can be obtained with low cost and high reproductivity.

The active matrix liquid crystal display device has been mainly disclosed in the present specification. However, the invention disclosed in the present specification can be applied to a flat panel display having other active matrix type using thin film transistors. For example, the invention can be applied to an active matrix display device integrated with a peripheral drive circuit using EL type light emitting elements.

The structure of a bottom gate type in which a gate electrode is on the side of a substrate may be used as the structure of the thin film transistor.

What is claimed is:

1. An active matrix electro-optical device comprising pixel electrodes arranged in a matrix form and thin film transistors arranged for the respective pixel electrodes, wherein when Vgr is a voltage required for one gradation, Ct is capacitance of all pixels, Cgd is capacitance between a gate and a drain, ΔVg is a difference between ON/OFF gate voltages, and ΔVs is a feedthrough voltage, the respective parameters satisfy an expression:

$|Vgr| > |(1/Ct)[Cgd·\Delta Vg - Ct·\Delta Vs]|$.

2. An active matrix electro-optical device comprising: an active matrix circuit including pixel electrodes arranged in a matrix form and thin film transistors arranged at the respective pixel electrodes; and a peripheral drive circuit made of thin film transistors and for driving the active matrix circuit, wherein when Vgr is a voltage required for one gradation, Ct is capacitance of all pixels, Cgd is capacitance between a gate and a drain, $\Delta Vg$ is a difference between ON/OFF gate voltages, and $\Delta Vs$ is a feedthrough voltage, the respective parameters satisfy an expression:

$|Vgr| > |(1/Ct)[Cgd·\Delta Vg - Ct·\Delta Vs]|$, and wherein a mobility of the thin film transistors of the peripheral drive circuit for driving a gate signal voltage is larger than a mobility of the thin film transistors arranged in the active matrix circuit.

* * * * *